(12) United States Patent
Perner

(10) Patent No.: US 6,804,145 B2
(45) Date of Patent: Oct. 12, 2004

(54) MEMORY CELL SENSING SYSTEM AND METHOD

(75) Inventor: Frederick Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 109 days.

(21) Appl. No.: 10/286,081

(22) Filed: Nov. 1, 2002

(65) Prior Publication Data

US 2004/0085794 A1 May 6, 2004

(51) Int. Cl.[7] .......................... G11C 11/00; G11C 11/14; G11C 11/15
(52) U.S. Cl. .......................... 365/158; 365/171; 365/173
(58) Field of Search ................................. 365/104, 158, 365/171, 173, 203, 207, 208, 230.03

(56) References Cited

U.S. PATENT DOCUMENTS

| 3,828,328 | A | * | 8/1974 | Ito .............................. 365/171 |
| 4,745,579 | A | * | 5/1988 | Mead et al. ................. 365/104 |
| 5,329,480 | A | * | 7/1994 | Wu et al. .................... 365/171 |
| 5,691,933 | A | * | 11/1997 | Takenaka ..................... 365/51 |
| 5,765,214 | A | * | 6/1998 | Sywyk ........................ 365/203 |
| 5,991,186 | A | * | 11/1999 | Balistreri et al. ...... 365/230.03 |
| 6,188,615 | B1 | | 2/2001 | Perner et al. |
| 6,260,103 | B1 | * | 7/2001 | Alexis et al. .......... 365/230.03 |
| 6,504,779 | B2 | * | 1/2003 | Perner ........................ 365/158 |
| 6,606,262 | B2 | * | 8/2003 | Perner ........................ 365/158 |
| 6,678,204 | B2 | * | 1/2004 | Nagashima et al. ... 365/230.03 |

* cited by examiner

Primary Examiner—Trong Phan
(74) Attorney, Agent, or Firm—Brian R. Short

(57) ABSTRACT

The invention includes a memory cell sensing system. The memory cell sensing system includes a plurality of memory cells located on a first plane of an integrated circuit. The system further includes a plurality of sense amplifiers located on a sense plane that is adjacent to the first plane. Each sense amplifier is connectable to at least one memory cell based upon a relative location of each sense amplifier with respect to locations of the at least one memory cell. The invention also includes a method of sensing a state of a selected memory cell within a plurality of memory cells. A plurality of the memory cells are located on a first plane of an integrated circuit. A plurality of sense amplifiers are located on a sense plane that is adjacent to the first plane. The method includes connecting a sense amplifier to at least one memory cell based upon a relative location of each sense amplifier with respect to locations of the at least one memory cell.

20 Claims, 10 Drawing Sheets

CONNECTING A SENSE AMPLIFIER TO AT LEAST ONE MEMORY CELL BASED UPON A RELATIVE LOCATION OF EACH SENSE AMPLIFIER WITH RESPECT TO LOCATIONS OF THE AT LEAST ONE MEMORY CELL

910

SENSING A LOGIC STATE OF THE AT LEAST MEMORY CELL

920

MEMORY CELL SENSING SYSTEM AND METHOD

FIELD OF THE INVENTION

The invention relates generally to electronic memory. More particularly, the invention relates to a method and apparatus for sensing a state of memory cells.

BACKGROUND OF THE INVENTION

Computing devices require memory. The memory can include read only memory (ROM) or random access memory (RAM). Generally, memory includes memory cells that are arranged in rows and columns. The individual memory cells are accessed through the use of row select lines and column select lines, typically referred to as word lines and bit lines.

FIG. 1 shows an array of random access memory (RAM) cells 110, a row decoder 120, a column decoder 130 and associated sense amplifiers 140. The row decoder 120 selects a row of the array of RAM cells 110 through a word line (WL). The column decoder 130 selects a column of the array of the RAM cell 110 through a bit line (BL). Generally, the sense amplifiers 140 are connectable to the bit lines. The sense amplifiers 140 provide sensing of states of the memory cells.

In a resistive RAM array, the resistance of each memory cell has more than one state. The data in a memory cell can be determined by measuring a resistive state of the cell. The resistive memory cells may include magnetic layers, a fuse or anti-fuse, or any element that stores information affecting a magnitude of a nominal resistance of the memory cell.

Magnetic random access memory (MRAM) is a type of resistive memory. MRAM can include a resistive cross point array of spin dependent tunneling (SDT) junctions. Each SDT junction memory element is located at a cross point of a word line and a bit line. The magnetization of each SDT junction assumes one of two stable orientations at any given time. These two stable orientation, parallel and anti-parallel, represent logic values of "0" and "1." The magnetization orientation affects the resistance of the SDT junction. The resistance of the SDT junction is a first value if the magnetization orientation is parallel and a second value if the magnetization orientation is anti-parallel. The magnetization orientation of the SDT junction, and therefore, its logic value may be determined by sensing the resistance of the SDT junction.

Generally, sensing the resistance of an SDT junction requires sensing relatively small signals. The resistance, and therefore, the logical state of an SDT junction can be determined by applying a voltage across the SDT junction and sensing the resultant current, or by applying a current through the SDT junction and sensing the resulting voltage across the SDT junction. SDT junctions include physical characteristics that require sensing either a small amplitude sense current, or a small amplitude sense voltage.

Due to the small signal levels, MRAM sense amplifiers provide output signals that are much smaller in amplitude that most memory sense amplifiers. Therefore, signal noise and interference must be minimized. MRAM circuitry selects and isolates individual MRAM memory cells within large two-dimensional arrays of MRAM cells. MRAM sense amplifiers rely on minimal signal noise and interference. Minimizing the MRAM sense amplifier noise and interference improves the reliability and performance of the MRAM sense circuits.

MRAM memory can include digital support circuitry. Digital circuitry can generate transient signals that can cause noise and distortion to couple to the MRAM memory cells, which can introduce noise and distortion to sensed MRAM signals.

It should be noted that other types of RAM (for example, SRAM and DRAM) do not require the signal noise and interference minimization required by MRAM, because other types of memory generally operate with much larger sense signals.

It is desirable to have a method and apparatus for sensing memory that provides for minimal sensing signal noise and interference.

SUMMARY OF THE INVENTION

The invention includes an apparatus and method for minimizing noise and interference of RAM sensed signals. The method and apparatus are adaptable for use with MRAM.

An embodiment of the invention includes a memory cell sensing system. The memory cell sensing system includes a plurality of memory cells located on a first plane of an integrated circuit. The system further includes a plurality of sense amplifiers located on a sense plane that is adjacent to the first plane. Each sense amplifier is connectable to at least one memory cell based upon a relative location of each sense amplifier with respect to locations of the at least one memory cell.

Another embodiment of the invention includes a method of sensing a state of a selected memory cell within a plurality of memory cells. A plurality of the memory cells are located on a first plane of an integrated circuit. A plurality of sense amplifiers are located on a sense plane that is adjacent to the first plane. The method includes connecting a sense amplifier to at least one memory cell based upon a relative location of each sense amplifier with respect to locations of the at least one memory cell.

Other aspects and advantages of the present invention will become apparent from the following detailed description, taken in conjunction with the accompanying drawings, illustrating by way of example the principles of the invention.

DETAILED DESCRIPTION

Figure 1:
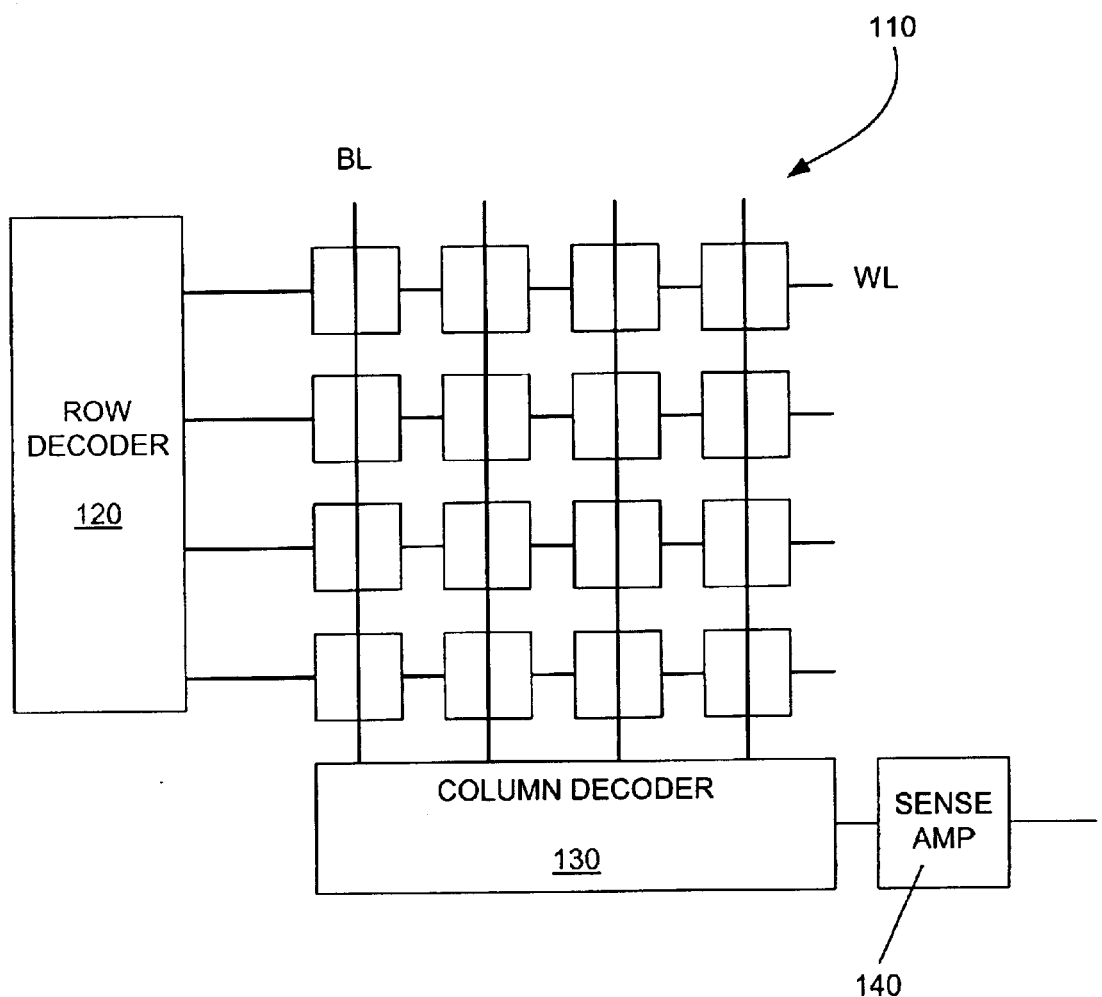
FIG. 1 shows a prior art integrated circuit that includes an array of memory cells and associated control circuitry located on a common plane.

As shown in the drawings for purposes of illustration, the invention is embodied in a method and apparatus for sensing states of memory cells. A sense amplifier associated with the memory cells can be selected based upon a physical location of the sense amplifiers relative to the memory cells to minimize coupling of electrical signals between the sense amplifiers and the memory cells.

The resistance of each memory cell within a resistive RAM array has more than one state, and data in the memory can be determined by measuring the resistive state of the cell. The resistive memory cells can include one or more magnetic layers, a fuse or anti-fuse, or any element that stores or generates information by affecting the magnitude of the nominal resistance of the element. Other types of resistive elements used in a resistive RAM array include poly-silicon resistors as part of a read-only memory, or floating gate transistors as part of optical memory, imaging devices or floating memory devices.

Figure 2:
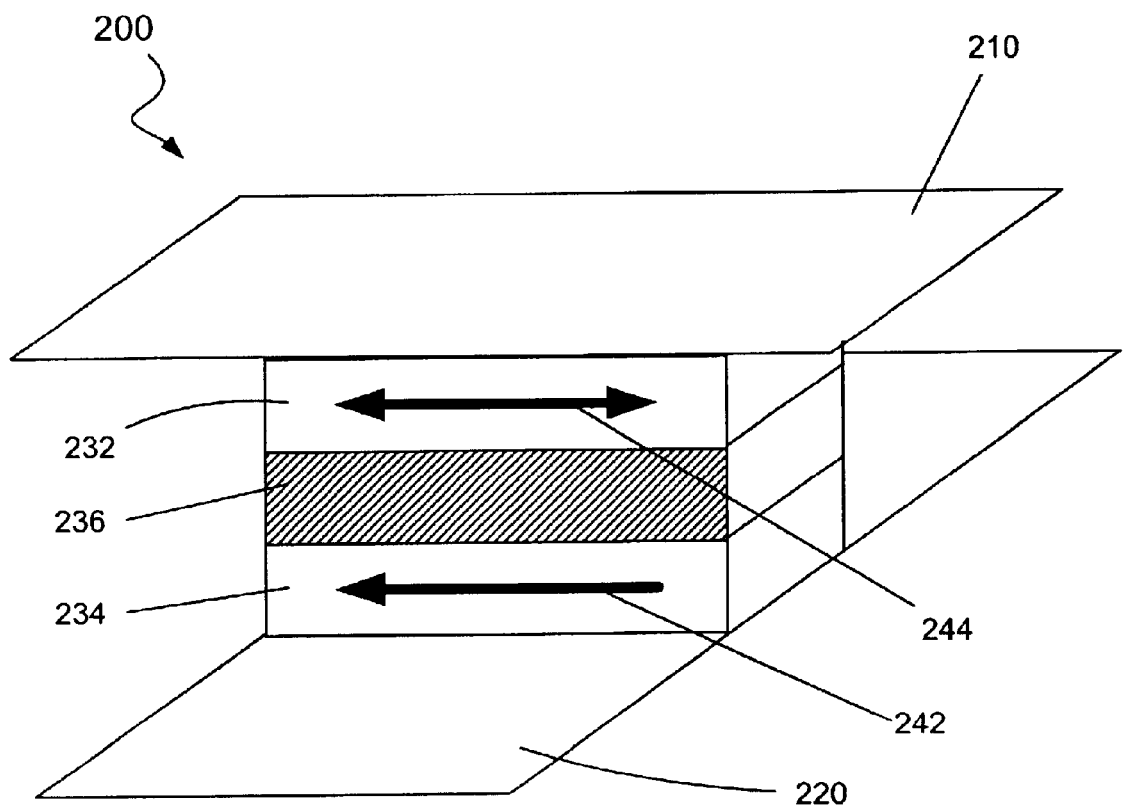
FIG. 2 shows an MRAM memory cell.

FIG. 2 shows an MRAM memory cell 200. The MRAM memory cell 200 can include a three layer magnetic tunnel junction memory cell. The magnetic tunnel junction stores a bit of information according to an orientation of a soft magnetic sense layer 232. Generally, the memory cell 200 includes two magnetic states that correspond to logical states of "1" and "0." The two-way arrow 244 of the sense layer 232 represents the binary states of the memory cell 200.

The memory cell 200 further includes a pinned layer 234. The pinned layer 234 includes a fixed magnetic orientation as depicted by the one-way arrow 242. As the name suggests, the magnetic orientation of the pinned layer 234 remains fixed.

The pinned layer 234 and the sense layer 232 are physically separated by an insulating layer 236. A resistance across the magnetic tunnel junction memory cell is determined by characteristics of the insulating layer, and the magnetic orientation of the sense layer 232 relative to the magnetic orientation of the pinned layer 234. If the magnetic orientation of the sense layer 232 is in the same direction as the magnetic orientation of the pinned layer 234, the memory cell 200 is in a "parallel" state. Similarly, if the magnetic orientation of the sense layer 232 is in the opposite direction as the magnetic orientation of the pinned layer 234, the memory cell 200 is in an "anti-parallel" state. The two mentioned orientations correspond to a low resistance state and a high resistance state, respectively. The low resistance state can correspond to the "0" state, and the high resistance state can correspond to the "1" state, or vice versa.

The magnetic state of a selected memory cell 200 can be altered by applying currents through a word line 210 and bit line 220 that are connected to each end of the memory cell 200. Currents conducting through the word line and the bit line produce two orthogonal magnetic fields that can switch the magnetic orientation of the sense layer 232 of the selected memory cell between the parallel and anti-parallel states. Unselected memory cells within an array of memory cells may be exposed to only a magnetic field from either the word line or the bit line crossing (connected to) the unselected memory cells. The single field exposure is generally not strong enough to change the magnetic orientation of the sense layer 232 of the unselected memory cells. Therefore, the unselected memory cell retain their original magnetic orientations.

Figure 3:
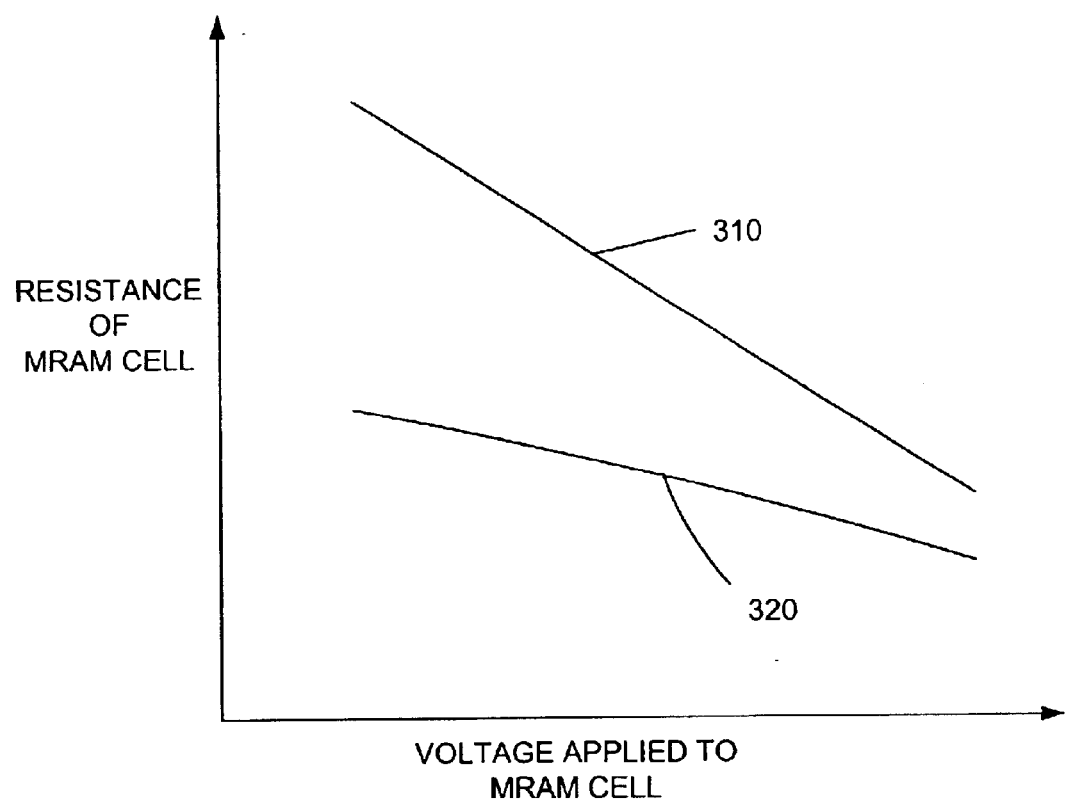
FIG. 3 is a plot showing a relationship between a resistance of an MRAM memory cell, and a voltage applied to the MRAM memory cell.

FIG. 3 is a plot showing a relationship between a resistance of an MRAM memory cell, and a voltage applied to the MRAM memory cell. As previously described, the states of the MRAM memory cells are determined by sensing a resistance of selected MRAM memory cells.

A first curve 310 represents the relative resistance of an MRAM memory cell when in a first state. The first state corresponds to the anti-parallel state. A second curve 320 represents the relative resistance of the MRAM memory cell when in a second state. The second state corresponds to the parallel state. Memory cells in the anti-parallel state tend to have a higher resistance than memory cells in the parallel state. As the curves 310, 320 depict, the resistance levels of the MRAM memory cells tend to decrease as a voltage potential across the MRAM memory cell increases.

Generally, the resistance of memory cells in the anti-parallel state decreases at a more rapid rate than the resistance of memory cells in the parallel state, as the voltage applied across the MRAM memory cell increases. The dynamic differences in resistance at different bias voltages is a trait of magnetic tunnel junction memory devices. As the curves 310, 320 depict, the resistive difference between the parallel state and the anti-parallel state decreases as the voltage potential across the MRAM memory cells increases.

As was previously described, the states of the MRAM memory cells are determined by sensing a resistive state of the memory cells. However, as the curves 310, 320 depict, the resistive difference between the parallel state and the anti-parallel state decreases as the voltage potential across the MRAM memory cells increases. Generally, determination of the state (parallel or anti-parallel) is easier if the resistive difference between the two states is greater. This suggests that a relatively small voltage potential should be applied to an MRAM memory cell when attempting to determine the state of the MRAM memory cell.

For the above-described reasons, the sense signals of MRAM typically include voltage amplitudes that are much smaller than other types of RAM (such as, DRAM and SRAM). However, the small amplitudes make the sensed signals more susceptible to noise, distortion and interference. Therefore, the system and method for sensing the states of MRAM memory cells should introduce a minimal amount of noise and interference.

Figure 4:
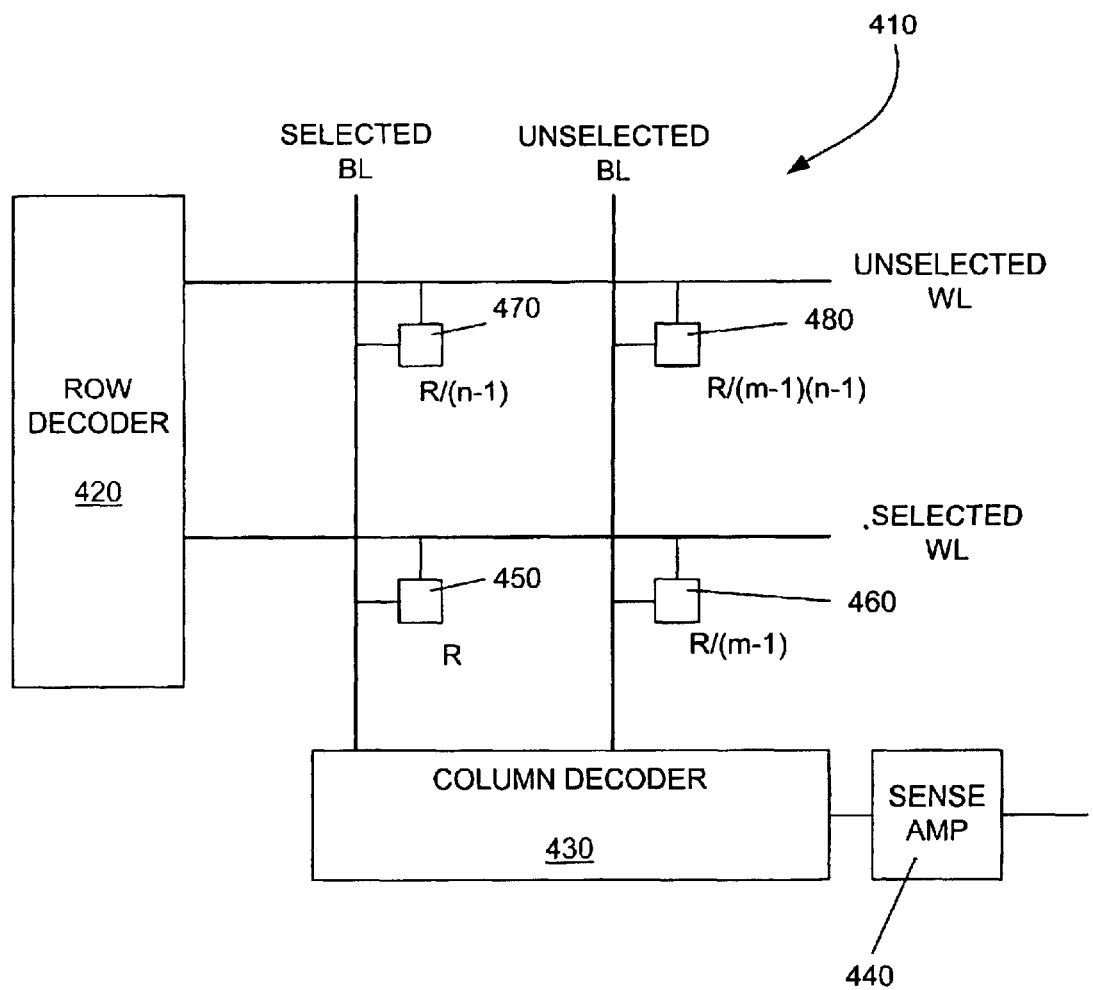
FIG. 4 shows a circuit schematic of an array of resistive MRAM memory cells and sense amplifiers.

FIG. 4 shows a circuit schematic of an array of resistive MRAM memory cells 410 and sense amplifiers 440. Here, the memory cells include resistors 450, 460, 470, 480. Generally, a row selector 420 selects rows of the memory cells through word lines (WL), and a column selector 430 selects columns of the memory cells through bit lines (BL).

FIG. 4 provides a depiction of the resistance of a selected memory cell relative to the combined resistances of the unselected memory cell in a memory array having m columns and n rows. The selected memory cell 450 is located between the selected bit line (BL) and the selected word line (WL), and includes a resistance value represented by R.

There are m−1 other memory cells in the same word line as the selected memory cell 450. Assuming the other memory cells each have nominally the same resistance value R, then they have a cumulative resistance value of R/(m−1), as shown by the equivalent resistance element 460. Similarly, there are n−1 other memory cells in the same bit line or column as the selected memory cell 450. Assuming the other memory cells each nominally have the same resistance value R, the they have a cumulative resistance value of R/(n−1), as shown at resistive element 470. Finally, there are (m−1)(n−1) other memory cells in the rest of the memory array that are not located on the same word line and bit line as the selected memory cell 450. Assuming each of these memory cells has a resistance value of R, then they have a cumulative resistance of R/(m−1)(n−1), as shown at resistive element 480.

Figure 5A:
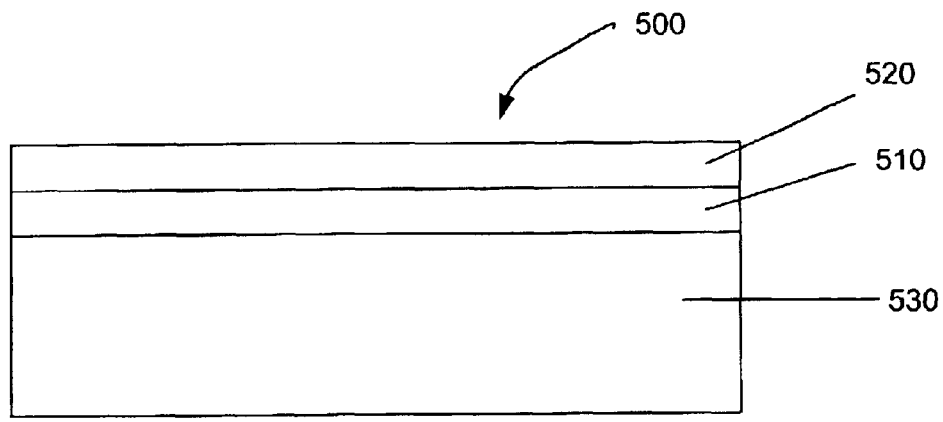
FIG. 5A shows a side-view and FIG. 5B shows a top-view of an embodiment of an integrated circuit that includes an array of MRAM memory cells on a first layer and sense amplifiers and selection circuitry on another layer.
Figure 5B:
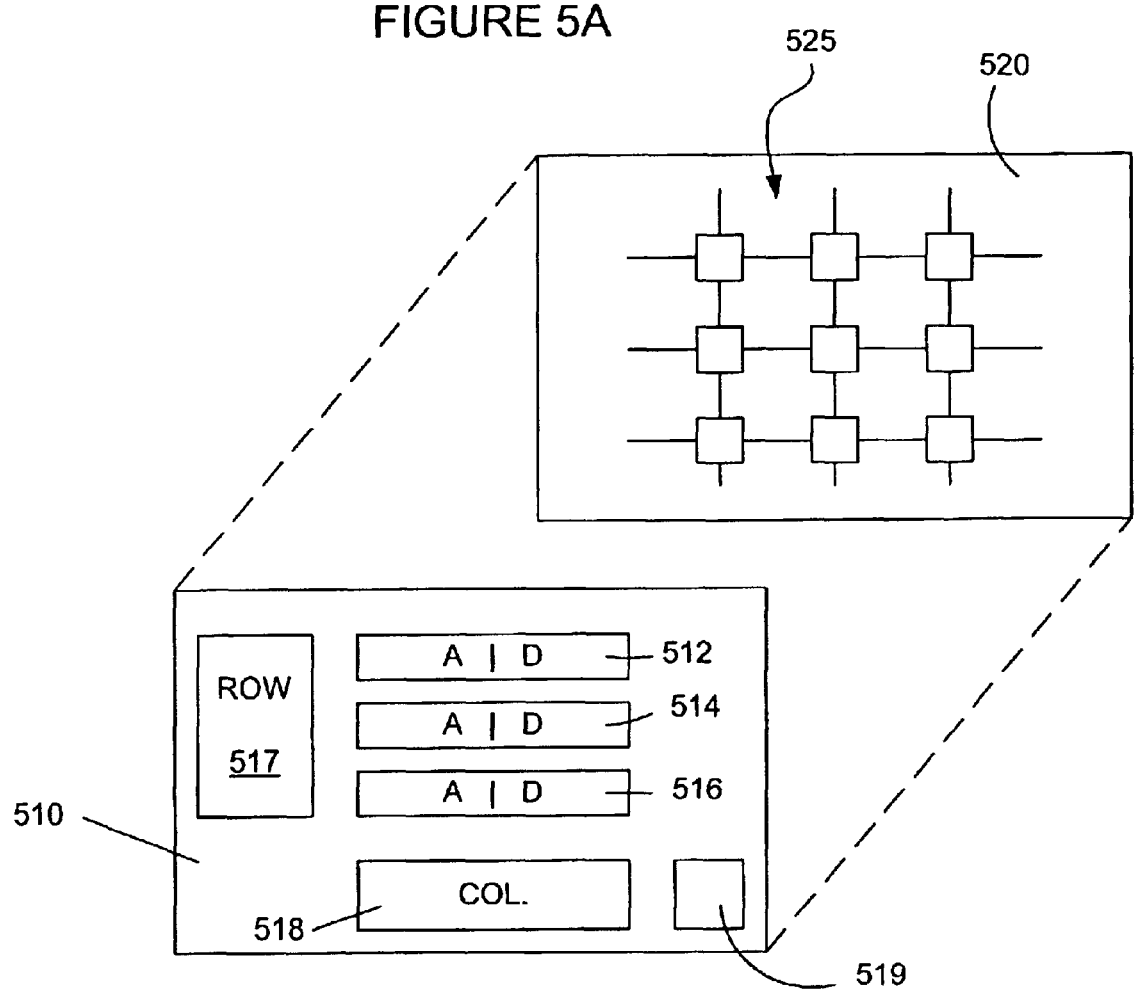

FIG. 5A shows a side-view and FIG. 5B shows a top-view of an embodiment of an integrated circuit 500 that includes an array of MRAM memory cells 525 on a first layer 520 and sense amplifiers 512, 514, 516, row selection circuitry 517, column selection circuitry 518, and control circuitry 519 on another layer 510. Generally, the sense amplifiers 512, 514, 516 include analog circuit sections (A) and digital circuit sections (D). The layers 510, 520 are formed over a substrate 530.

Generally, the sense amplifiers include some digital circuitry that is connected to a clock. Noise and interference can be coupled to the MRAM memory cells due to the digital circuitry. The digital circuitry includes waveforms that switch from a high potential to a low potential, and from a low potential to a high potential. As a result, the digital circuitry can include high frequency transients that can couple to other circuitry through common power supplies, or through electromagnetic propagation. Noise and interference generated by the digital circuitry can also couple to the MRAM memory cells through signal lines and clock lines.

As shown in FIG. 5A and FIG. 5B, the digital circuitry of the sense amplifiers 512, 514, 516 can be located physically proximate to the array of MRAM memory cells 525. The physical proximity can make the MRAM memory cells 525 vulnerable to noise and interference created by the digital circuitry. Generally, selected rows of memory cells can be connected to digital section of sense amplifiers that are located proximate to the selected rows.

The noise and interference created by the digital circuitry can be reduced by including ground planes and shielding between the MRAM memory cells and the digital circuitry. However, the additional ground planes and shielding can be very expensive.

Figure 6:
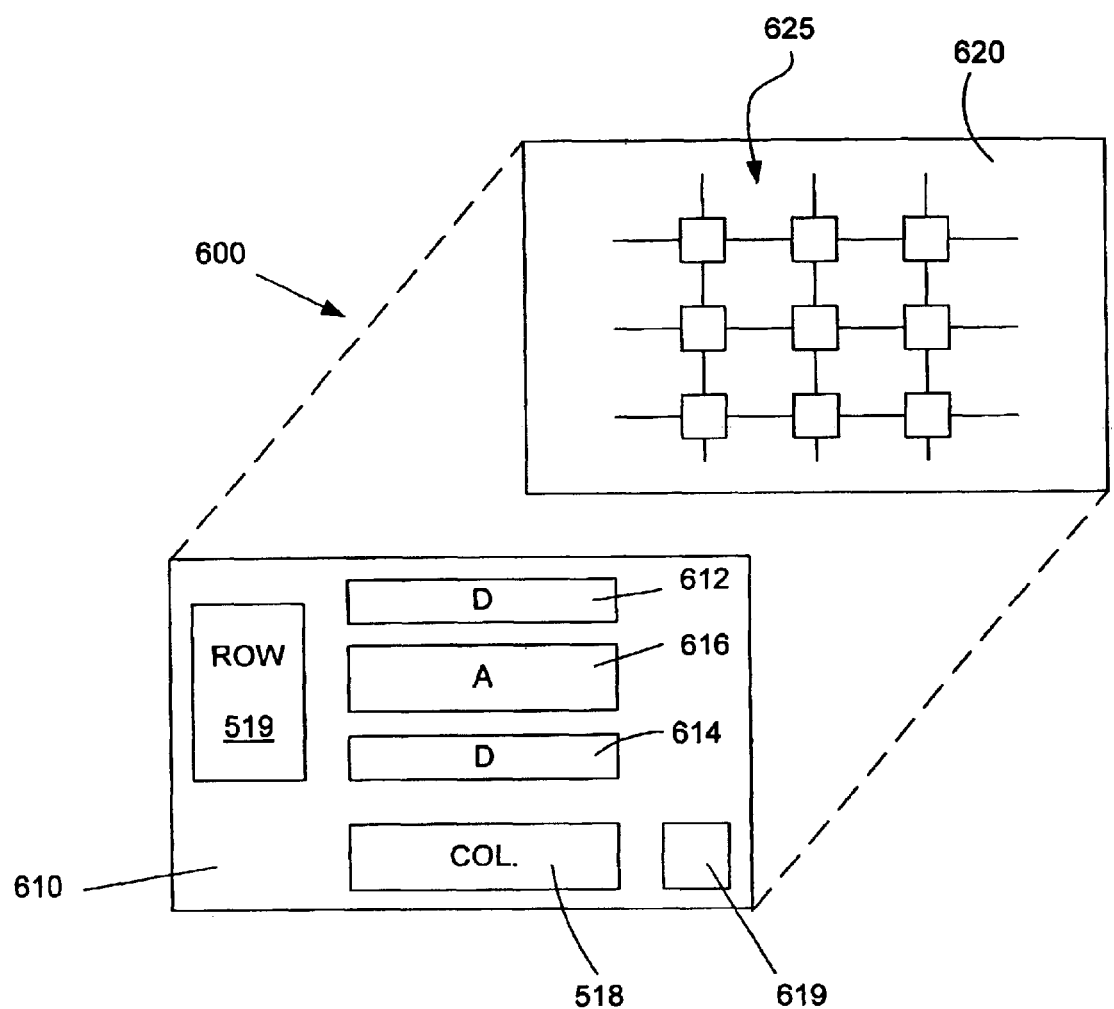
FIG. 6 shows an integrated circuit that includes an array of MRAM memory cells on a first layer and sense amplifiers on another layer according to an embodiment of the invention.

FIG. 6 shows an integrated circuit 600 that includes an array of MRAM memory cells 625 on a first layer 620, and sense amplifier sections 612, 614, 616 on a second layer 610 according to an embodiment of the invention. Generally, the first layer 620 is located adjacent to the second layer 610.

The sense amplifier sections 612, 614, 616 of this embodiment include sets of digital circuits 612, 614 separated by an analog circuit section 616. Spatially, the digital circuits 612, 614 are redistributed about the second layer 610. The redistribution allows active digital circuits of the sense amplifiers to be displaced from the MRAM memory cell being selected.

Generally, a sense amplifier includes both analog circuit sections and digital circuit sections. In FIG. 6, the analog section 616 has been spatially separated from digital sections 612, 614. This configuration allows the digital sections of the sense amplifiers to be physically located within the second layer 610 so that the digital sections are not proximate to selected memory cells of the first layer 620.

The invention includes controls for directing the connections between selected memory cells and digital circuits of the sense amplifiers so that selected memory cells are not proximately located near active digital circuits. The controls can include knowledge of physical locations of memory cells and digital circuits of the sense amplifiers. For example, a row address can be used to identify the location of a memory cell. If that memory cells is selected, the controls can direct the output of the selected memory cell to digital circuits of a sense amplifier that is not located proximate to the selected memory cells.

The location of a memory cell can be designated according to a row address of the memory cell, a column address of the memory cell, or both the row and column address of the memory cell.

Whether a selected memory cell is proximate can be predetermined. Alternatively, a digital circuit of a sense amplifier can be selected if the digital circuit is the least proximate digital sense amplifier available, thereby, ensuring the best performance.

The controls of the invention can be implemented using basic digital control logic gates as are well known in the art of digital electronics. The functionality includes the above-described controls. More precisely, controls for directing the connections between selected memory cells and digital circuits of the sense amplifiers.

Figure 7A:
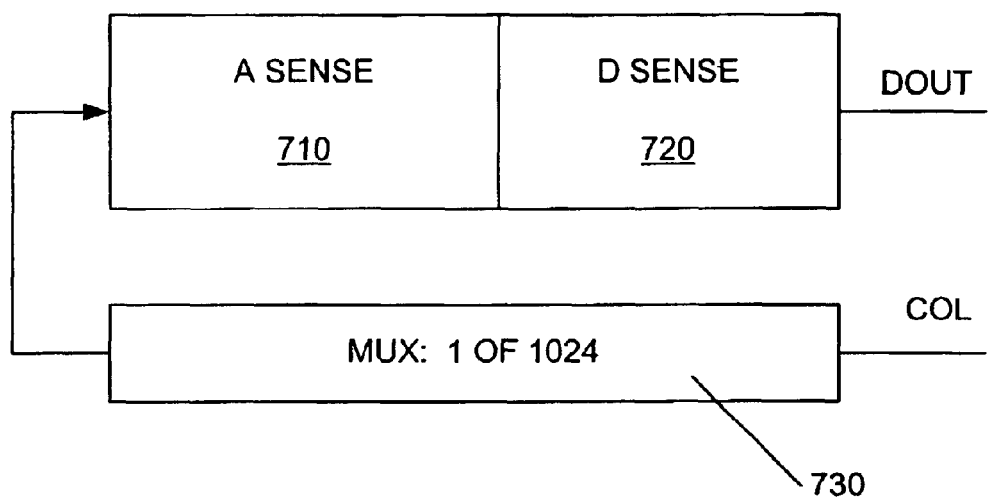
FIG. 7A shows an embodiment of a sense amplifier.

FIG. 7A shows an embodiment of a sense amplifier. The sense amplifier includes an analog circuit section 710 and a digital circuit section 720. This sense amplifier is provided as an example of a sense amplifier that can be compared with an alternate embodiment of FIG. 7B.

The embodiment of FIG. 7A includes a 1 to 1024 multiplexer 730 that is connected to 1024 columns (COL) of an MRAM array of memory that can include 256 rows. The multiplexer 730 selects a column of the array for connection to the analog sense amplifier 710. The analog circuit section 710 of the sense amplifier generates an output that is connected to the digital circuit section 720 of the sense amplifier. The digital circuit section 720 of the sense amplifier generates an output DOUT that represents a sensed value of a state of the selected memory cell of the 256×1024 array of memory cells.

Figure 7B:
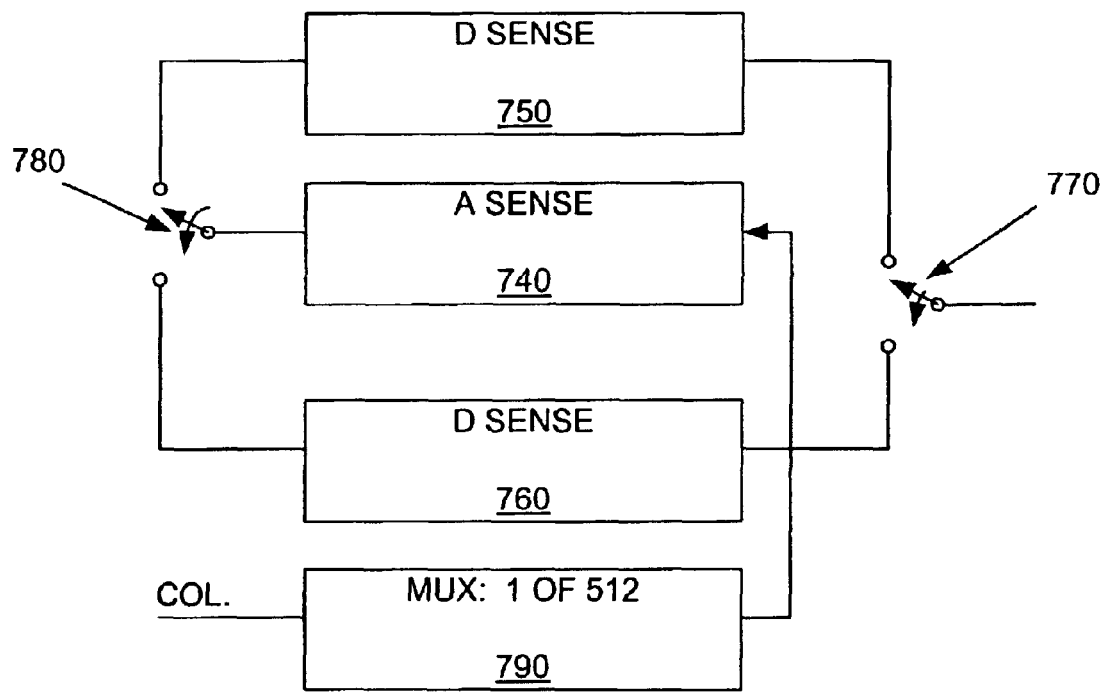
FIG. 7B shows a sense amplifier according to an embodiment of the invention.

FIG. 7B shows a sense amplifier according to an embodiment of the invention. This embodiment includes an analog circuit section 740 of the sense amplifier that is connectable to either a first digital circuit section 750 of the sense amplifier or a second digital circuit section 760 of the sense amplifier through a first switch 780. An output DOUT is generated by either the first digital circuit section 750 of the sense amplifier or the second digital circuit section 760 of the sense amplifier as determined by the setting of the first switch 780 and a second switch 770.

The embodiment of FIG. 7B includes a 1 to 512 multiplexer 790 that is connected to 512 columns (COL) of an MRAM array of memory that can include 512 rows. The multiplexer 790 selects a column of the array for connection to the analog circuit section 740 of the sense amplifier. The analog circuit section 740 of the sense amplifier generates an output that is connected to either the first digital circuit section 750 of the sense amplifier, or the second digital circuit section 760 of the sense amplifier. The digital circuit sections of the sense amplifier generate an output DOUT that represents a sensed value of a state of the selected memory cell of the 512×512 array of memory cells.

As previously mentioned, the invention includes controls for directing the connections between selected memory cells and digital circuit section of sense amplifiers so that selected memory cells are not proximately located near active digital circuit sections of the sense amplifiers. The controls can include knowledge of physical locations of memory cells and digital circuit sections of the sense amplifiers. For example, a row and column address can be used to identify the location of a memory cell. If that memory cells is selected, the controls can direct the output of the selected memory cell to a digital circuit sections of the sense amplifier that is not located proximate to the selected memory cells.

As shown in FIG. 7B, the switches 770, 780 can be selected based upon a physical location of the selected memory cell. The digital sense amplifier 750, 760 least proximate to the selected memory cell can be selected.

Figure 8:
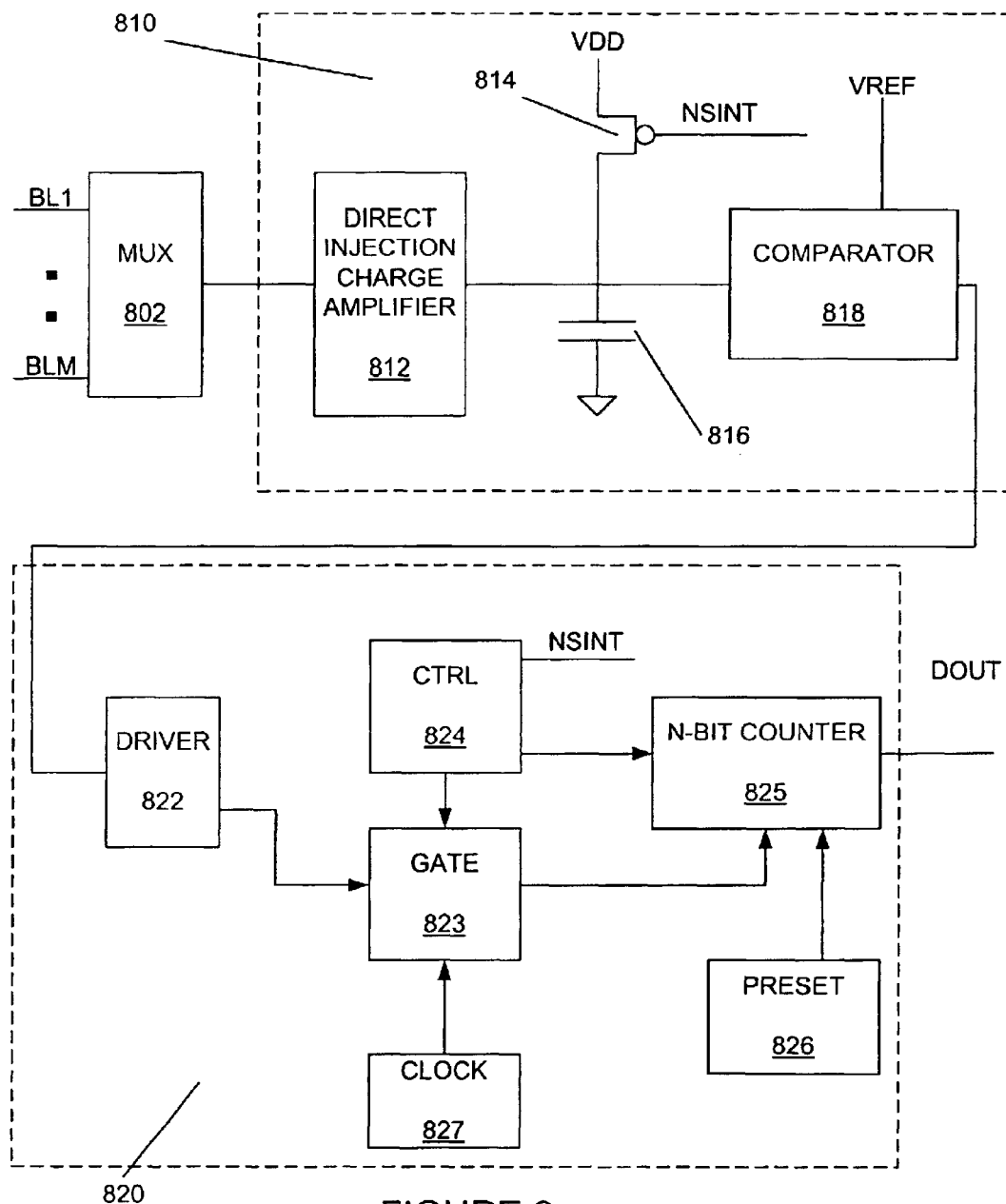
FIG. 8 shows an embodiment of an analog sense amplifier and a digital sense amplifier.

FIG. 8 shows an embodiment of an analog section 810 of a sense amplifier and a digital section 820 of a sense amplifier. These are merely examples of a possible analog section 810 and a digital section 820. Other possible configurations are possible. As previously described, the analog section 810 can be connectable to multiple digital sections 820 depending upon a physical location of multiple digital sections 820 with respect to a physical location of a selected memory cell.

The analog section 810 receives a bit line to be sensed from a previously described multiplexer (MUX) 802. The analog section 810 can include a direct injection charge amplifier (DICA) 812, a reset switch 814, an integrator capacitor 816, and a comparator 818.

The reset switch 814 may be a PMOS transistor. An external control signal (NSINT) controls whether the reset switch 814 is on (conducting) or off (not conducting). When the reset switch 814 is on, a supply voltage (VDD) is applied to the integrator capacitor 816 and a selected memory cell through the DICA 812. The integrator capacitor 816 is charged as current flows through the reset switch 814 and a selected memory cell. When the reset switch 814 is off, current flowing to the selected memory cell is supplied by the integrator capacitor 816. As long as the integrator capacitor 816 voltage is greater than a voltage across the selected memory cell, the integrator capacitor functions as a linear integrator.

A DICA 812 that can minimize a voltage difference across memory cells is disclosed in U.S. Pat. No. 6,188,615, issued on Feb. 13, 2001. The DICA 812 includes a high gain negative feedback amplifier for controlling a selected bit line voltage (a sense voltage) to a set value and minimizing the variance of the sense voltage over a wide range of sense currents.

A resistance of a selected memory cell and the capacitance of the integrator capacitor 816 determine how fast the integrator capacitor 816 is discharged after the reset switch 814 is opened. All other parameters being equal, the integrator capacitor 816 discharges faster when the selected memory cell has a resistance of R (a first state) than when the selected memory cell has a resistance of R plus delta R (a second state).

The sense amplifier (analog and digital sections) measures the integration time to determine the resistive state of the selected memory cell, and therefore, the logic value stored in the selected memory cell. The voltage potential of the integrator capacitor 816 is compared to a reference voltage (VREF) by the comparator 818. The output of the comparator 818 is connected to the digital section 820 of the sense amplifier through a driver 822.

The digital section 820 can include the driver 822, an N-bit counter 825, a high frequency clock 827, a gate 823, a controller 824 and a preset unit 826.

The gate 823 determines the starting and stopping of the clock 827. The clock 827 causes the counter 825 to increment a counter value at the clock frequency. If the clock 827 is started when the reset switch 814 is turned off, and the clock 827 is stopped when the integrator capacitor 816 equals the reference voltage (VREF), the counter value stored in the counter 825 indicates the amount of time for voltage on the integrator capacitor 816 to decay to the reference value (VREF).

Sensing a selected memory cell without resetting the counter 825 to a zero value produces a cumulative time measurement. Before a read operation (sensing of a selected memory cell state), the negative of a threshold is preloaded into the counter 825. After a cumulative time measurement, the most significant bit of the counter value represents the logic value stored in the selected memory cell. An output DOUT is the most significant bit of the counter 825.

A preset unit 826 can temporarily store values of the counter 825, and can up load its content into the counter. The preset unit 826 can also be loaded with specific values.

The controller 824 provides control of the reset switch 814, the counter 825, the gate 823, and the preset unit 826. The controller 824 allows the sense amplifier to operate under different modes.

Figure 9:
FIG. 9 shows acts of a method according to an embodiment of the invention.

FIG. 9 shows acts of a method according to an embodiment of the invention. The embodiment includes a method for sensing a state of a selected memory cell within a plurality of memory cells. A plurality of the memory cells are located on a first plane of an integrated circuit, and a plurality of sense amplifiers are located on a sense plane that is adjacent to the first plane. The memory cells can include MRAM memory cells.

A first step 910 includes connecting a sense amplifier to at least one memory cell based upon a relative location of each sense amplifier with respect to locations of the at least one memory cell.

A second step 920 includes sensing a logic state of the at least memory cell.

Connecting each sense amplifier to at least one memory cell can be based upon a distance requirement between each sense amplifier and the at least one memory cell.

Each of the sense amplifiers can include a digital circuit section. Each sense amplifier can be connectable to at least one memory cell based upon a relative location of each digital circuit section of the sense amplifier with respect to locations of the at least one memory cell.

Each sense amplifier can further include an analog circuit section. The analog sense circuit section of each sense amplifier can be connectable to at least one memory cell based upon a relative location of each analog circuit section with respect to locations of the at least one memory cell, and an associated digital circuit section.

Each analog sense circuit section can be connectable to a plurality of digital circuit sections. The connection can be determined by a relative location of each digital circuit section with respect to locations of the at least one memory cell.

Figure 10:
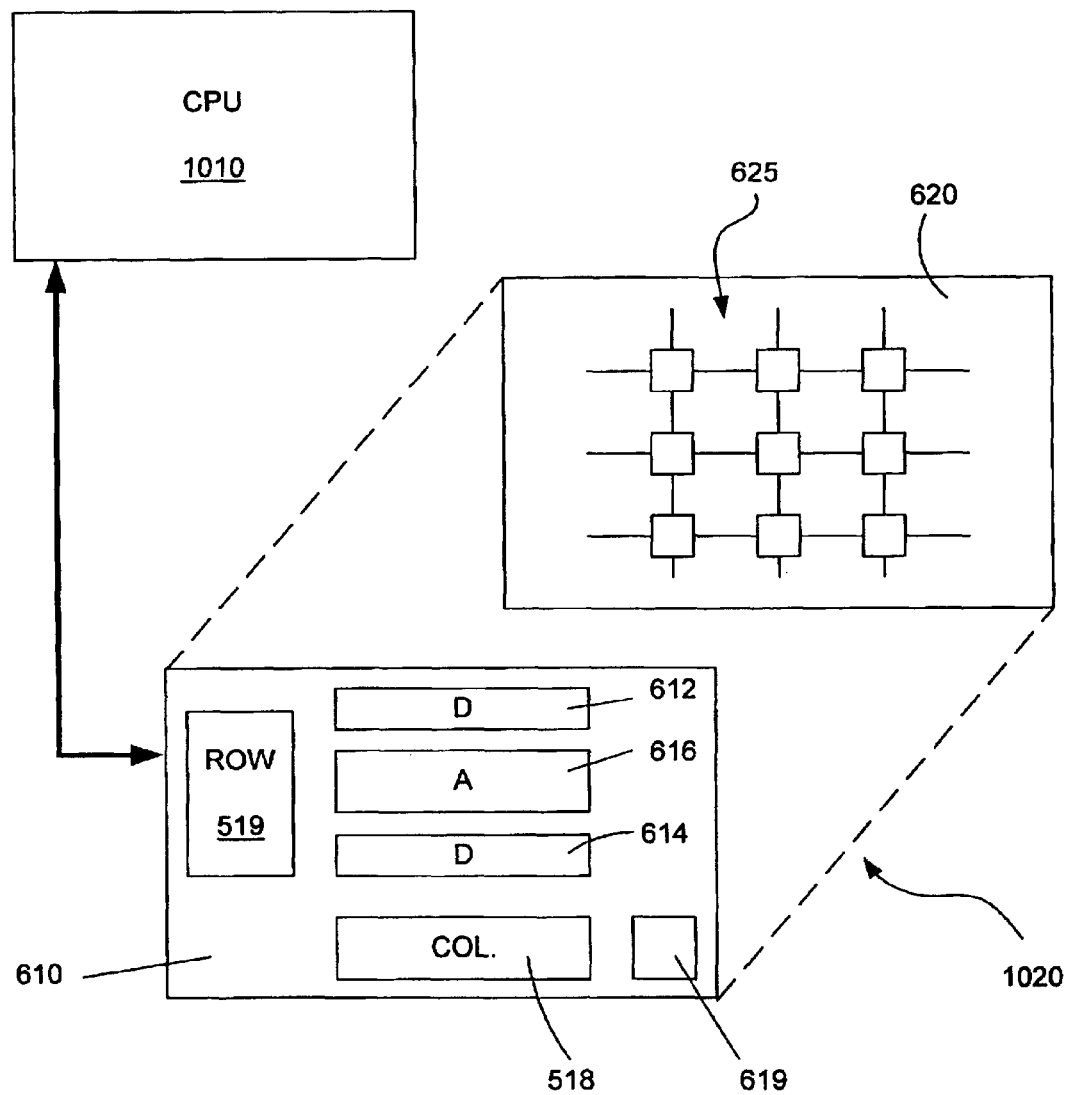
FIG. 10 shows a computer system according to an embodiment of the invention.

FIG. 10 shows a computer system according to an embodiment of the invention. This system includes a central processing unit 1010 that interfaces with an MRAM system 1020 similar to the embodiment shown in FIG. 6. MRAM provides features that are desirable in computer systems. For example, MRAM is non-volatile, which is useful in some computer applications.

The MRAM memory system can include an array of MRAM cells including rows and columns of MRAM cells. A plurality of memory cells can be located on a first plane of an integrated circuit. A plurality of sense amplifiers can be located on a sense plane that is adjacent to the first plane. Each sense amplifier is connectable to at least one memory cell based upon a relative location of each sense amplifier with respect to locations of the at least one memory cell.

Each of the sense amplifiers can include a digital circuit section. Each sense amplifier can be connectable to at least one memory cell based upon a relative location of each digital circuit section with respect to locations of the at least one memory cell.

Although specific embodiments of the invention have been described and illustrated, the invention is not to be limited to the specific forms or arrangements of parts so described and illustrated. The invention is limited only by the appended claims.

What is claimed:

1. A memory cell sensing system comprising:
   a plurality of memory cells located on a first plane of an integrated circuit;
   a plurality of sense amplifiers located on a sense plane that is adjacent to the first plane, each sense amplifier connectable to at least one memory cell based upon a relative location of each sense amplifier with respect to locations of the at least one memory cell.

2. The memory cell sensing system of claim 1, wherein connecting each sense amplifier to at least one memory cell is based upon a minimum physical distance requirement between each sense amplifier and the at least one memory cell.

3. The memory cell sensing system of claim 1, wherein connecting each sense amplifier to at least one memory cell is based upon a minimum electromagnetic isolation between each sense amplifier and the at least one memory cell.

4. The memory cell sensing system of claim 1, wherein the memory cells comprise MRAM memory cells.

5. The memory cell sensing system of claim 1, wherein each of the sense amplifiers comprise digital circuit sections, and each sense amplifier is connectable to at least one memory cell based upon a relative location of each digital circuit section with respect to locations of the at least one memory cell.

6. The memory cell sensing system of claim 5, wherein each sense amplifier further comprises an analog circuit section, the analog circuit section of each sense amplifier being connectable to at least one memory cell based upon a relative location of each analog circuit section with respect to locations of the at least one memory cell, and an associated digital circuit section.

7. The memory cell sensing system of claim 6, wherein each analog circuit section is connectable to a plurality of digital circuit sections, the connection being determined by a relative location of each digital circuit section with respect to locations of the at least one memory cell.

8. The memory cell sensing system of claim 1, wherein the memory cells are arranged in rows and columns.

9. The memory cell sensing system of claim 8, wherein each sense amplifier is connectable to at least one row of memory cells depending upon a row selection and a column selection address.

10. The memory cell sensing system of claim 9, wherein each sense amplifier is connectable to at least one row of memory cells through a selectable multiplexer.

11. A method of sensing a state of a selected memory cell within a plurality of memory cells, a plurality of memory cells located on a first plane of an integrated circuit, a plurality of sense amplifiers located on a sense plane that is adjacent to the first plane, the method comprising:
    connecting a sense amplifier to at least one memory cell based upon a relative location of each sense amplifier with respect to locations of the at least one memory cell.

12. The method of sensing a state of a selected memory cell of claim 11, wherein connecting each sense amplifier to at least one memory cell is based upon a distance requirement between each sense amplifier and the at least one memory cell.

13. The method of sensing a state of a selected memory cell of claim 11, wherein the memory cells comprise MRAM memory cells.

14. The method of sensing a state of a selected memory cell of claim 11, wherein each of the sense amplifiers comprise a digital circuit section, and each sense amplifier is connectable to at least one memory cell based upon a relative location of each digital circuit section of the sense amplifier with respect to locations of the at least one memory cell.

15. The method of sensing a state of a selected memory cell of claim 14, wherein each sense amplifier further comprises an analog circuit section, the analog sense circuit section of each sense amplifier is connectable to at least one memory cell based upon a relative location of each analog circuit section with respect to locations of the at least one memory cell, and an associated digital circuit section.

16. The method of sensing a state of a selected memory cell of claim 15, wherein each analog sense circuit section is connectable to a plurality of digital circuit sections, the connection being determined by a relative location of each digital circuit section with respect to locations of the at least one memory cell.

17. An MRAM memory comprising:
    an array of MRAM cells comprising rows and columns of MRAM cells;
    a plurality of memory cells located on a first plane of an integrated circuit;
    a plurality of sense amplifiers located on a sense plane that is adjacent to the first plane, each sense amplifier connectable to at least one memory cell based upon a relative location of each sense amplifier with respect to locations of the at least one memory cell.

18. The MRAM memory of claim 17, wherein each of the sense amplifiers comprise a digital circuit section, and each sense amplifier is connectable to at least one memory cell based upon a relative location of each digital circuit section with respect to locations of the at least one memory cell.

19. A computer system comprising:
    a central processing unit;
    MRAM memory connected to the central processing unit, the MRAM memory comprising:
    an array of MRAM cells comprising rows and columns of MRAM cells;
    a plurality of memory cells located on a first plane of an integrated circuit;
    a plurality of sense amplifiers located on a sense plane that is adjacent to the first plane, each sense amplifier connectable to at least one memory cell based upon a relative location of each sense amplifier with respect to locations of the at least one memory cell.

20. The MRAM memory of claim 19, wherein each of the sense amplifiers comprise a digital circuit section, and each sense amplifier is connectable to at least one memory cell based upon a relative location of each digital circuit section with respect to locations of the at least one memory cell.

* * * * *